US008409938B2

(12) United States Patent
Park

(10) Patent No.: US 8,409,938 B2

(45) Date of Patent: Apr. 2, 2013

(54) METHOD FOR FABRICATING SEMICONDUCTOR DEVICE

(75) Inventor: Jung-Hee Park, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 13/348,242

(22) Filed: Jan. 11, 2012

(65) Prior Publication Data

US 2012/0115322 A1 May 10, 2012

Related U.S. Application Data

(62) Division of application No. 12/894,840, filed on Sep. 30, 2010, now Pat. No. 8,114,724.

(30) Foreign Application Priority Data

Jun. 10, 2010 (KR) ........................ 10-2010-0054877

(51) Int. Cl.
*H01L 21/00* (2006.01)

(52) U.S. Cl. ........ 438/157; 438/176; 438/195; 438/669; 257/204

(58) Field of Classification Search .................. 438/157, 438/176, 195, 669; 257/204
See application file for complete search history.

(56) References Cited

U.S. PATENT DOCUMENTS

| | | | | |
|---|---|---|---|---|
| 5,328,810 | A * | 7/1994 | Lowrey et al. | 430/313 |
| 5,935,875 | A | 8/1999 | Lee | |
| 6,063,688 | A * | 5/2000 | Doyle et al. | 438/424 |
| 6,124,162 | A | 9/2000 | Lin | |
| 6,180,448 | B1 * | 1/2001 | Lee | 438/253 |
| 6,613,621 | B2 * | 9/2003 | Uh et al. | 438/183 |
| 6,684,118 | B2 * | 1/2004 | Wu et al. | 700/99 |
| 7,091,117 | B2 * | 8/2006 | Kim et al. | 438/585 |
| 7,227,215 | B2 * | 6/2007 | Park et al. | 257/306 |
| 7,271,436 | B2 | 9/2007 | Lee et al. | |
| 7,429,536 | B2 * | 9/2008 | Abatchev et al. | 438/725 |
| 7,485,913 | B2 | 2/2009 | Ogawa | |
| 7,615,437 | B2 | 11/2009 | Sung et al. | |
| 7,704,875 | B1 * | 4/2010 | Wu et al. | 438/637 |
| 7,807,575 | B2 * | 10/2010 | Zhou | 438/696 |
| 7,914,973 | B2 | 3/2011 | Ryou et al. | |
| 7,968,468 | B2 | 6/2011 | Terada et al. | |

OTHER PUBLICATIONS

Notice of Allowance issued by the United States Patent and Trademark Office on Aug. 7, 2012.

* cited by examiner

*Primary Examiner* — Jarrett Stark
*Assistant Examiner* — Nicholas Tobergte
(74) *Attorney, Agent, or Firm* — IP & T Group LLP

(57) ABSTRACT

A method for fabricating a semiconductor device includes: forming a plurality of photoresist patterns over a substrate structure; forming an insulation layer for a spacer over a structure including the photoresist patterns; forming a plurality of spacers on sidewalls of the photoresist patterns by anisotropically etching the insulation layer, and forming a first opening through the insulation layer; and forming second openings in the insulation layer to expose the substrate structure.

5 Claims, 12 Drawing Sheets

205A
204B
201
202A 202B 202C

METHOD FOR FABRICATING SEMICONDUCTOR DEVICE

CROSS-REFERENCE TO RELATED APPLICATION

This application is a division of U.S. patent application Ser. No. 12/894,840 filed on Sep. 30, 2010 now U.S. Pat. No. 8,114,724, which claims priority of Korean Patent Application No. 10-2010-0054877, filed on Jun. 10, 2010, and is related to another application that is a division of U.S. patent application Ser. No. 12/894,840 and is filed on the same date as the filing date of this application. This disclosure of each of the foregoing applications is incorporated herein by reference in its entirety.

BACKGROUND OF THE INVENTION

Exemplary embodiments of the present invention relate to a technology for fabricating a semiconductor device, and more particularly, to a method for forming fine patterns in a semiconductor device. Exemplary embodiments of the present invention are useful for a method for forming fine metal interconnections.

As a semiconductor device become highly integrated, formation of fine patterns is desirable. However, due to the limited resolution of exposure equipment, it is difficult to fabricate a device having fine patterns using 20 nm or under 20 nm process.

In order to address such a concern, a spacer patterning technology (SPT) which forms spacers on sidewalls of a hard mask and performing indirect patterning is often used. Such a technology is, for example, disclosed in Korean Unexamined Patent Publication No. 2008-0113857.

FIGS. 1A to 1G are cross-sectional views illustrating a method for forming metal interconnections by using a typical SPT process.

Referring to FIG. 1A, contact plugs 102*a*, 102*b* and 102*c* are formed through an insulation layer 101 while being spaced apart from one another by a predetermined distance. An insulation layer 103 is formed on the plugs 102*a*, 102*b* and 102*c* and the insulation layer 101, and a hard mask layer 104 and a non-reflective layer 105 are formed on the insulation layer 103. Photoresist patterns 106 are formed on the non-reflective layer 105 to overlap the plugs 102*a* and 102*c*. The insulation layer 103 includes silicon oxide and the hard mask layer 104 includes a carbon-based thin film.

Referring to 1B, the non-reflective layer 105 and the hard mask layer 104 are etched by using the photoresist patterns 106 as an etch barrier, and remaining photoresist patterns and non-reflective layer are removed, thereby forming hard mask patterns 104*a* and 104*c*.

Referring to 1C, a thin film 107 for a spacer is deposited on the resultant structure including the hard mask patterns 104*a* and 104*c*. The thin film 107 for a spacer includes a metal having an etching selectivity with respect to the insulation layer 103. Referring to 1D, the thin film 107 is etched to form spacers 107*a*.

Referring to 1E, the hard mask patterns 104*a* and 104*c* are removed, and the insulation layer 103 is etched by using the spacers 107*a* as an etch barrier, thereby forming an insulation pattern 103*a*.

Referring to 1F and 1G, a metal layer 108 is deposited on a resultant structure including the insulation pattern 103*a* and is planarized using chemical mechanical polishing (CMP) until the insulation pattern 103*a* is exposed, thereby forming metal interconnections 108*a*.

As described above, in the conventional method for forming the metal interconnections, the process is relatively complicated.

For example, according to the prior art, the total of five layers including the insulation layer, the hard mask layer, the non-reflective layer, the thin film for a spacer, and the metal layer are used. Furthermore, according to the prior art, etching processes are performed three times, that is, etching of the hard mask layer, etching for the spacer, and etching of the insulation layer.

SUMMARY OF THE INVENTION

An embodiment of the present invention is directed to a method for forming fine metal interconnections by using a simplified process in which the number of thin films stacked and used is small and the number of etching processes is small.

In accordance with an embodiment of the present invention, a method for fabricating a semiconductor device includes: forming a plurality of photoresist patterns over a substrate structure; forming an insulation layer for a spacer over a structure including the photoresist patterns; forming a plurality of spacers on sidewalls of the photoresist patterns by anisotropically etching the insulation layer, and forming a first opening through the insulation layer to expose the substrate structure; and forming second openings in the insulation layer to expose the substrate, by removing the photoresist patterns.

In accordance with another embodiment of the present invention, a method for fabricating a semiconductor device includes: forming a first opening through an insulation layer of a semiconductor structure by removing the insulation layer in a region having a top surface lower than a top surface of a photoresist pattern of the semiconductor structure while leaving the insulation layer over a sidewall of the photoresist pattern, wherein the insulation layer covers the top surface of the photoresist pattern before the removal of the insulation layer; and forming a second opening through the insulation layer by removing the photoresist pattern, wherein the semiconductor structure includes a conductive member and the photoresist pattern contacts the conductive member before the removal of the photoresist pattern.

In accordance with another embodiment of the present invention, a method for fabricating a semiconductor device includes: forming a first insulation layer over a substrate structure; forming first to third conductive members which extend through the first insulation layer and are spaced apart from one another in a first direction; forming a first photoresist pattern and a second photoresist pattern which overlap the first and third conductive members and extend in a direction substantially perpendicular to the first direction; forming an insulation layer for a spacer over a structure including the first photoresist pattern and the second photoresist pattern; forming a plurality of spacers on sidewalls of the first photoresist pattern and the second photoresist pattern by anisotropically etching the insulation layer, and forming a first opening through which the second conductive member is exposed; and forming second openings, through which the first and third conductive members are exposed, by removing the first photoresist pattern and the second photoresist pattern.

DESCRIPTION OF SPECIFIC EMBODIMENTS

Figure 1A:
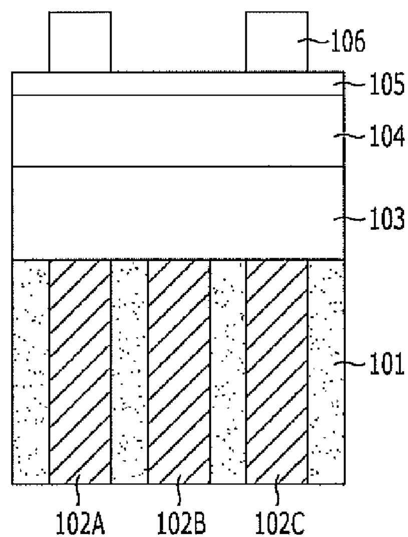
FIGS. 1A to 1G are cross-sectional views illustrating a method for forming a metal interconnection by using a typical SPT process.
Figure 1B:
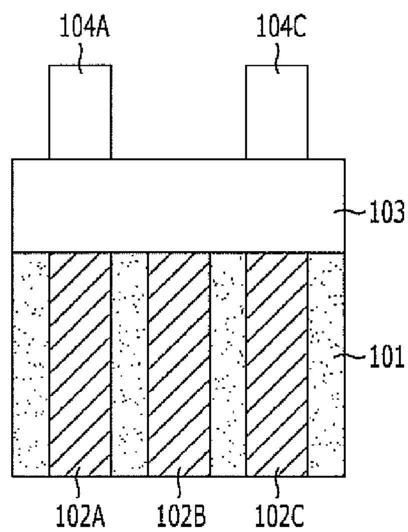
Figure 1C:
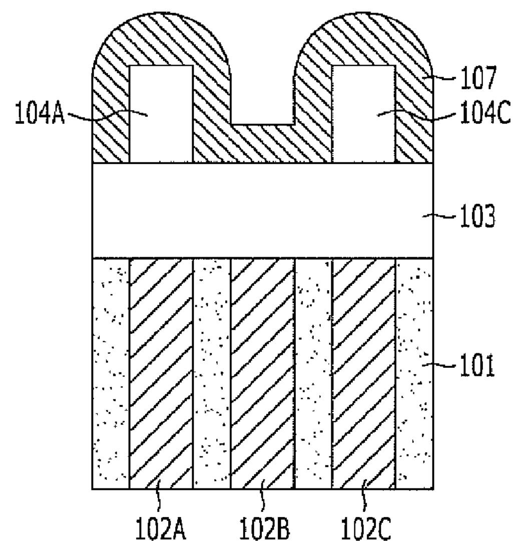
Figure 1D:
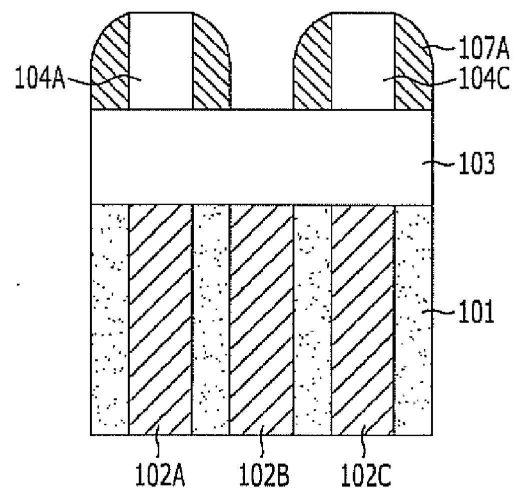
Figure 1E:
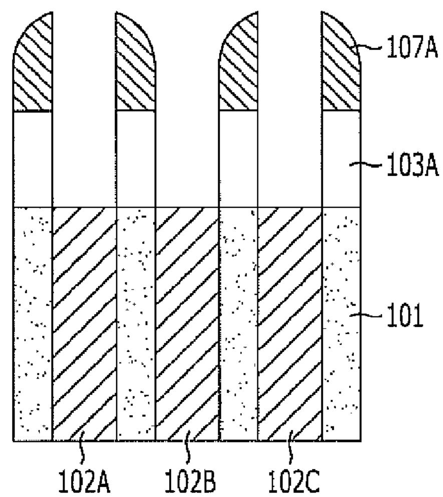
Figure 1F:
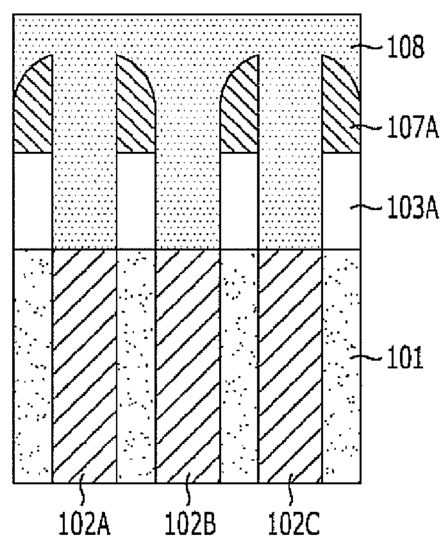
Figure 1G:
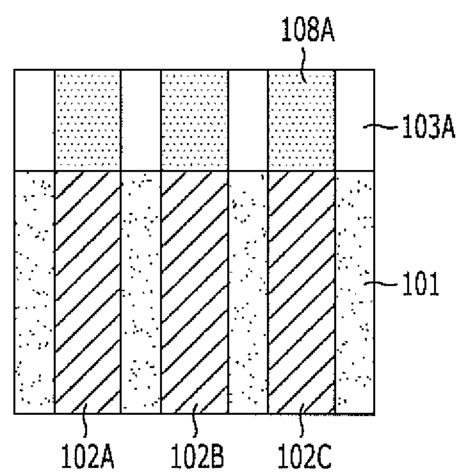

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 2A to 2H are plan views illustrating a method for forming metal interconnections in accordance with an embodiment of the present invention, and FIGS. 3A to 3H are cross-sectional views of a semiconductor device along line A-A' in FIGS. 2A to 2H.

Figure 2A:
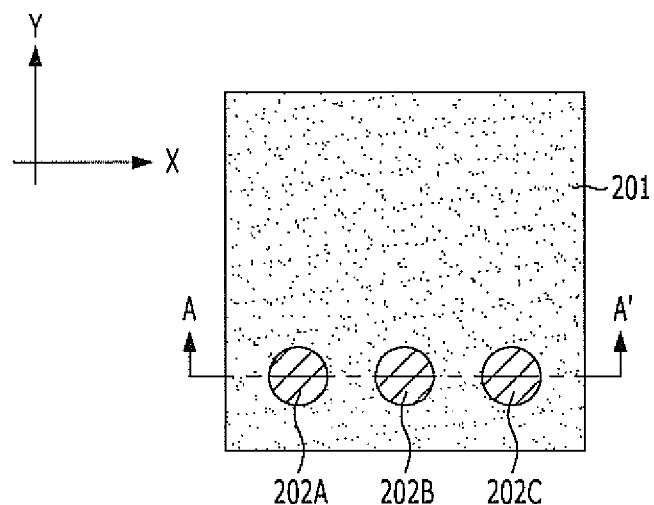
FIGS. 2A to 2H are plan views illustrating a method for forming metal interconnections in accordance with an exemplary embodiment of the present invention.
Figure 3A:
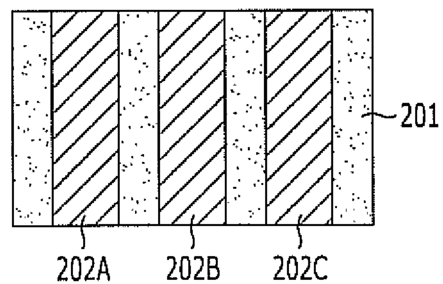
FIGS. 3A to 3H are cross-sectional views of a semiconductor device along line A-A' in FIGS. 2A and 2H.

Referring to FIGS. 2A and 3A, an insulation layer 201 is formed on a substrate subject to desired processes and forms semiconductor structure. A plurality of contact plugs 202*a*, 202*b* and 202*c* are formed through the insulation layer 201. Although not shown in FIGS. 2A and 3A, the contact plugs 202*a*, 202*b* and 202*c* are coupled to a conductive layer (a polysilicon layer or a metal layer) below the insulation layer 201 and forms a part of a substrate structure. As shown in the plan view of FIG. 2A, the contact plugs 202*a*, 202*b* and 202*c* are spaced apart from one another at a predetermined interval in the X direction. The contact plugs 202*a*, 202*b* and 202*c* may use a metal such as polysilicon or tungsten as a conductive member.

Figure 2B:
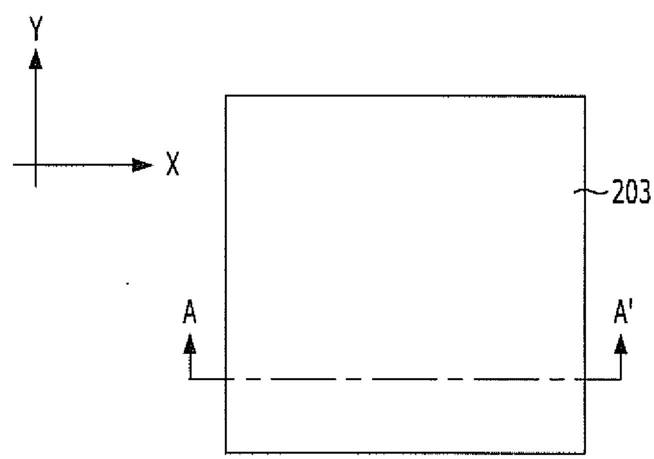
Figure 3B:
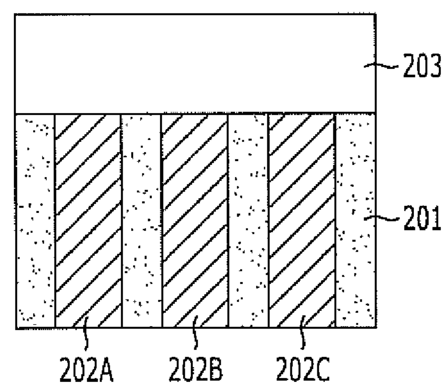

Referring to FIGS. 2B and 3B, photoresist 203 is coated on a resultant structure including the contact plugs 202*a*, 202*b* and 202*c*.

Figure 2C:
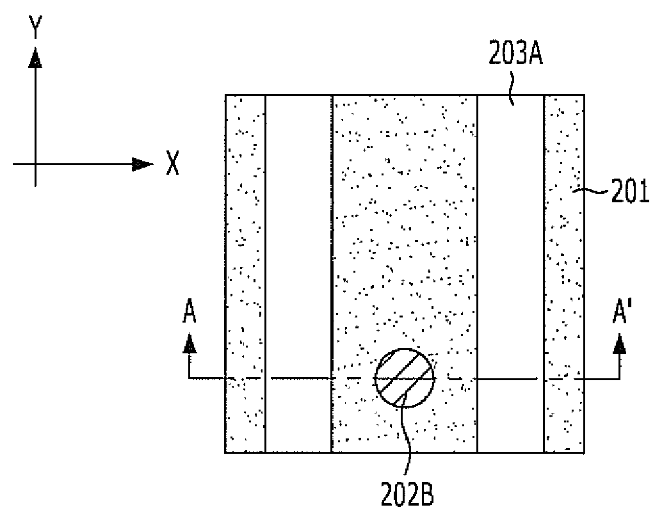
Figure 3C:
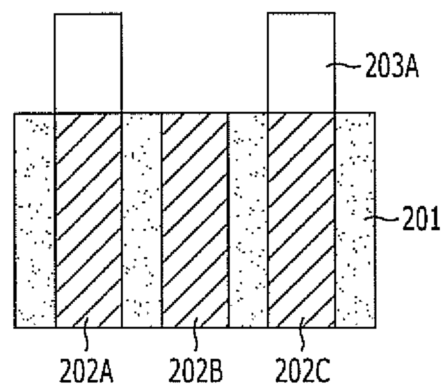

Referring to FIGS. 2C and 3C, photoresist patterns 203*a* are formed through an exposure and development process using a photo mask. The photoresist patterns 203*a* have a line pattern shape extending in the Y direction. The photoresist patterns 203*a* overlap the contact plugs 202*a* and 202*c*, but do not overlap the contact plug 202*b*. That is, the photoresist patterns 203*a* do not overlap the contact plug located at the center among the three adjacent contact plugs.

Figure 2D:
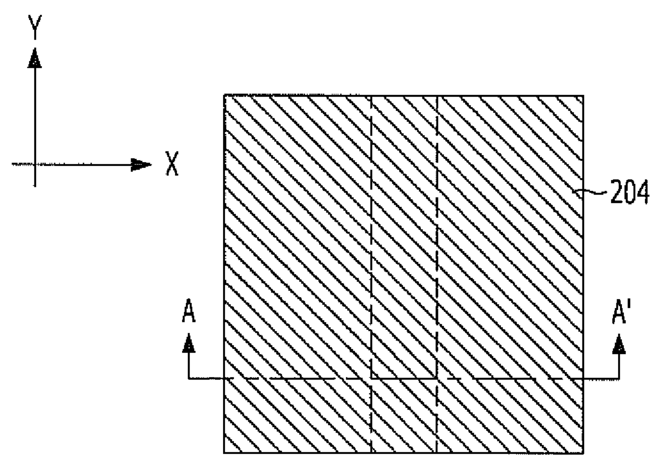
Figure 3D:
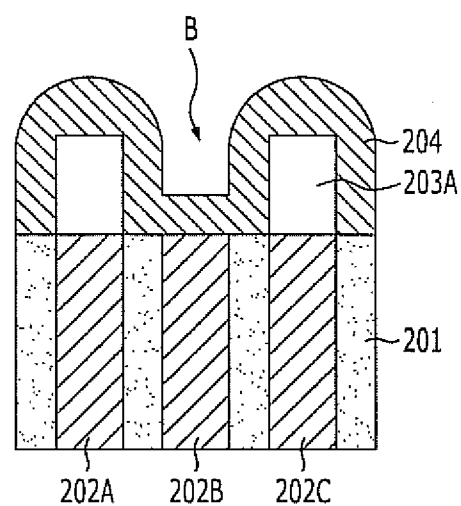

Referring to FIGS. 2D and 3D, an insulation layer 204 for a is spacer, which has a predetermined thickness, is formed according to a topology of a resultant structure including the photoresist patterns 203*a*. The deposition thickness of the insulation layer 204 is adjusted such that a recess section B is formed between the photoresist patterns 203*a*, that is, above the contact plug 202*b*.

Figure 2E:
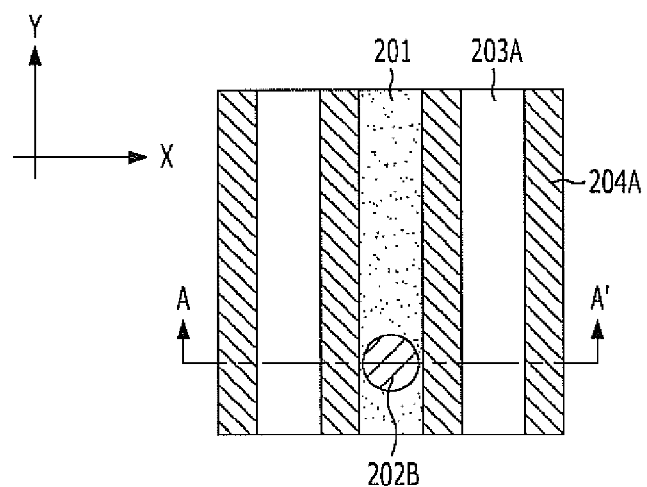
Figure 3E:
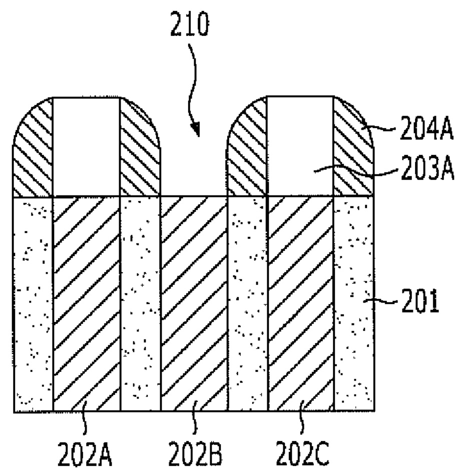

Referring to FIGS. 2E and 3E, the insulation layer 204 is anisotropically etched until the contact plug 202*b* is exposed, thereby forming spacers 204*a* on the sidewalls of the photoresist patterns 203*a*. The spacers 204*a* have a line pattern shape extending in the Y direction. A first opening 220*b*, through which the contact plug 202*b* is exposed, is formed.

Figure 2F:
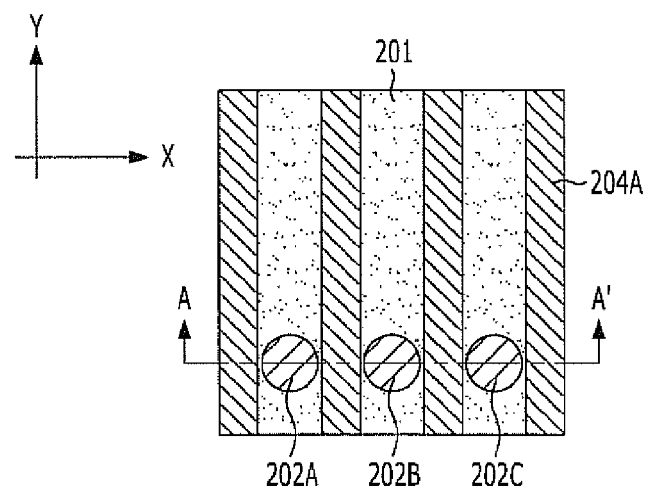
Figure 3F:
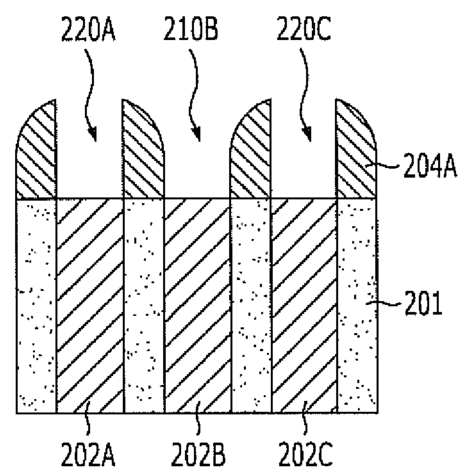

Referring to FIGS. 2F and 3F, the photoresist patterns 203*a* are removed. The photoresist patterns 203*a* may be removed using, for example, $O_2$ plasma strip. Thus, second openings 220*a* and 220*c*, through which the contact plugs 202*a* and 202*c* are exposed, are formed.

Figure 2G:
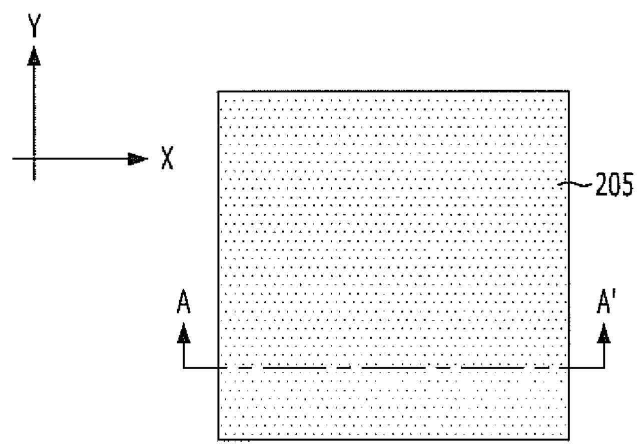
Figure 2H:
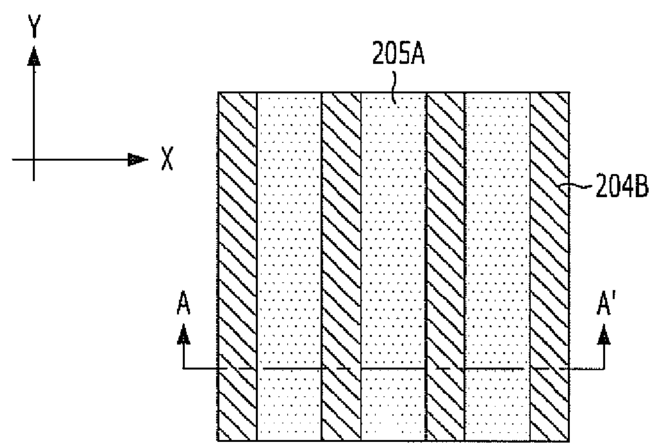
Figure 3G:
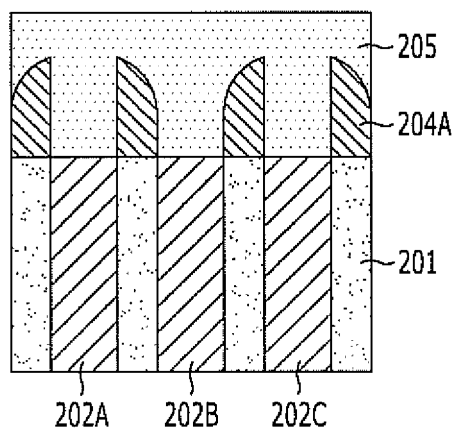
Figure 3H:
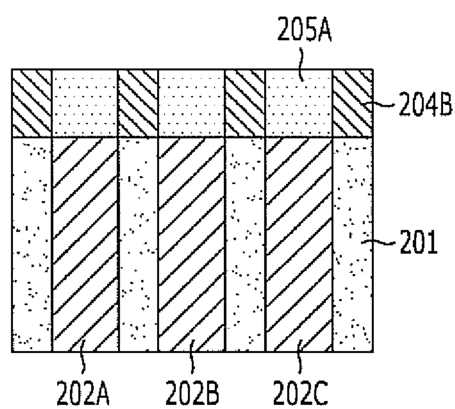

Referring to FIGS. 2G and 3G, a metal layer 205 is formed on a resultant structure including the spacers 204*a*. Referring to FIGS. 2H and 3H, the wafer surface is polished until the spacers 204*a* are sufficiently exposed and the metal layer is separated, thereby forming metal interconnections 205*a*. The metal interconnections 205*a* are separated from one another by spacers 204*b* after the polishing, and serve as line patterns coupled to the contact plugs 202*a*, 202*b* and 202*c*. After leaving the spacers 204*b* as insulation layers for separating the metal interconnections 205*a* from one another, a passivation layer (not shown) may be formed.

In accordance with the embodiment of the present invention, a method for forming metal interconnections on contact plugs (or via plugs) is described as an example and does not limit the present invention. For example, the present invention may be applied in forming fine patterns including repeated lines and spaces where there are no contact plugs.

In accordance with an exemplary embodiment of the present invention, since two thin films including an insulation layer for a spacer and a metal layer are used, the number of thin films stacked is reduced/decreased.

Furthermore, in accordance with an exemplary embodiment of the present invention, a multiple etching process is not necessary. For example, only etching process for a spacer may be performed.

As a result, in accordance with the embodiment of the present invention, the fabrication process may be significantly simplified, where the product yield may be improved, the production time may be shortened, and the fabricating cost may be reduced.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:

forming a first opening through an insulation layer of a semiconductor structure by removing the insulation layer in a region having a top surface lower than a top surface of a photoresist pattern of the semiconductor structure while forming spacers by leaving the insulation layer over a sidewall of the photoresist pattern, wherein the insulation layer covers the top surface of the photoresist pattern before the removal of the insulation layer; and forming a second opening through the insulation layer by removing the photoresist pattern, wherein the semiconductor structure includes a conductive member and the photoresist pattern contacts the conductive member before the removal of the photoresist pattern, wherein the forming of the first opening opens up a surface of a second conductive member and a second insulation layer is interposed between the first and conductive members horizontally.

2. The method of claim 1, wherein the forming of the spacers includes forming spacers that each gradually slope from a vertical angle to a less vertical angle in joining the spacer to one of the photoresist patterns.

3. The method of claim 2, further comprising forming a conductive layer in the first and second openings, wherein the forming of the conductive layer comprises:

depositing the conductive layer over a structure including the first opening and the second openings; and polishing a surface of the conductive layer until gradual sloped portions of the spacers are polished away and the spacers have a uniform width.

4. The method of claim 2, further comprising forming a passivation layer over the polished conductive layer and the exposed spacers.

5. The method of claim 1, wherein the insulation layer includes oxide or nitride.

* * * * *